(12) United States Patent
Kitano et al.

(10) Patent No.: US 8,088,678 B2
(45) Date of Patent: Jan. 3, 2012

(54) SEMICONDUCTOR MANUFACTURING APPARATUS AND METHOD

(75) Inventors: Naomu Kitano, Ichikawa (JP); Takashi Minami, Fuchu (JP); Motomu Kosuda, Machida (JP); Heiji Watanabe, Suita (JP)

(73) Assignee: Canon Anelva Corporation, Kawasaki-shi (JP)

( * ) Notice: Subject to any disclaimer, the term of this patent is extended or adjusted under 35 U.S.C. 154(b) by 54 days.

(21) Appl. No.: 12/631,286

(22) Filed: Dec. 4, 2009

(65) Prior Publication Data

US 2010/0120238 A1    May 13, 2010

Related U.S. Application Data

(63) Continuation of application No. PCT/JP2007/061570, filed on Jun. 7, 2007.

(51) Int. Cl.
   *H01L 32/05* (2006.01)
(52) U.S. Cl. ........ 438/586; 438/287; 438/308; 438/591; 257/761; 257/E21.477; 204/298.25; 118/719
(58) Field of Classification Search .................. 118/719; 204/198.25; 257/761, E21.477; 438/287, 438/308, 586, 591
See application file for complete search history.

(56) References Cited

U.S. PATENT DOCUMENTS

| | | | |
|---|---|---|---|
| 5,882,165 A * | 3/1999 | Maydan et al. | 414/217 |
| 6,440,261 B1 * | 8/2002 | Tepman et al. | 414/222.01 |
| 6,734,069 B2 * | 5/2004 | Eriguchi | 438/287 |
| 6,740,585 B2 * | 5/2004 | Yoon et al. | 438/680 |
| 2003/0124873 A1 * | 7/2003 | Xing et al. | 438/770 |
| 2005/0233526 A1 | 10/2005 | Watanabe et al. | 438/287 |
| 2006/0194396 A1 * | 8/2006 | Sunil et al. | 438/287 |
| 2007/0128736 A1 * | 6/2007 | Chang et al. | 438/3 |
| 2009/0178621 A1 | 7/2009 | Sunil et al. | 118/729 |

FOREIGN PATENT DOCUMENTS

JP    2002-184773    6/2002

(Continued)

OTHER PUBLICATIONS

Watanabe et al. ("Thermal Degradation of HfSiON Dielectrics Caused by TiN Gate Electrodes and Its Impact on Electrical Properties" J. J. of Applied Physics, vol. 45, No. 4B, pp. 2933-2938, 2006).*

(Continued)

*Primary Examiner* — Charles Garber
*Assistant Examiner* — Yasser Abdelaziez
(74) *Attorney, Agent, or Firm* — Fitzpatrick, Cella, Harper & Scinto (57) ABSTRACT

A first aspect of the present invention provides a semiconductor manufacturing apparatus including: a load lock chamber; a transfer chamber; and a treatment chamber 1 and a treatment chamber 2 which carry out treatment using plasma, wherein, in the treatment chamber 2, an exhaust means is provided with a control means for making an oxygen partial pressure into $1*10^{-5}$ [Pa] or less. A second aspect of the present invention provides a method for forming a high dielectric constant film and a metal electrode successively, the method including the steps of: (1) depositing a metal film on a silicon oxide film or a silicon oxynitride film in the treatment chamber 1; (2) forming, in the treatment chamber 2, a high dielectric constant film by using the metal film formed in the treatment chamber 1; and (3) depositing, in the treatment chamber 1 or a treatment chamber 3 installed additionally, a metal electrode material on the high dielectric film formed in the treatment chamber 2, wherein the steps are carried out successively without being exposed to the atmosphere.

13 Claims, 8 Drawing Sheets

FOREIGN PATENT DOCUMENTS

| | | | |
|---|---|---|---|
| JP | 2002184773 | * | 6/2002 |
| JP | 2003-249497 | | 9/2003 |
| JP | 2006-237371 | | 9/2006 |
| WO | 2004/008544 | | 1/2004 |

OTHER PUBLICATIONS

Watabi [JP 2002184733] English machine translation.*

Stemmer et al. ("Stability of ZrO2 layers on Si (001) during high-temperature anneals under reduced oxygen partial pressures", J. Applied Physics, 92(1), pp. 82-86, 2002).*

Kawahara, T. et al., "Effect of Hf Sources, Oxidizing Agents, and $NH_3$/Ar Plasma on the Properties of $HfAlO_x$, Films Prepared by Atomic Layer Deposition", Japanese Journal of Applied Physics, vol. 43, No. 7A, pp. 4129-4134 (2004).

Watanabe, H., et al., "Novel In-situ Fabrication Method for High-quality Metal/High-k Gate Stacks by Utilizing Low-damage Sputtering System," Canon ANELVA Technical Reports, vol. 13, pp. 5-10 (2007) (with English-language translation).

* cited by examiner

FIG. 9

SEMICONDUCTOR MANUFACTURING APPARATUS AND METHOD

CROSS-REFERENCES TO RELATED APPLICATIONS

This application is a continuation application of International Application No. PCT/JP2007/061570, filed on Jun. 7, 2007, the entire contents of which are incorporated by reference herein.

BACKGROUND OF THE INVENTION

1. Field of the Invention

The present invention relates to an apparatus and method for forming a high dielectric constant film and for depositing a metal electrode material film on a high dielectric constant film in manufacturing a metal oxide semiconductor field effect transistor (MOSFET). More specifically, the present invention relates to the apparatus and method for enhancing interfacial properties, in the MOSFET, between the high dielectric constant film and the metal electrode material film while realizing reduction of impurities in the high dielectric constant film and reduction of an equivalent oxide film thickness value. In addition, the present invention relates to a substrate treatment system suitable for this method.

2. Related Background Art

Currently, the metal oxide semiconductor field effect transistor (MOSFET) is manufactured by using a silicon oxide film in a gate insulation film and using polysilicon in a gate electrode and combining them. As a tendency with respect to manufacturing of a semiconductor device, a design rule of the semiconductor device has been reduced gradually for enhancing a performance of an integrated circuit. In connection with this, layer-thinning of the gate insulation film is required. However, in the gate insulation film using the silicon oxide film, the layer-thinning has a limit. That is, the layer-thinning exceeding the limit causes an increase of a leakage current exceeding an allowable range as a result.

Then, an application of the gate insulation film having a relative dielectric constant higher than that of the silicon oxide film is investigated. Such gate insulation film is called a high dielectric constant film. When the high dielectric constant film is used in the gate insulation film, the gate electrode must be changed into a metal electrode from the polysilicon. It is because there are two reasons described in the following. A first one is that polysilicon is not compatible with almost all high dielectric constant films. A second one is that using polysilicon causes the problem that a depletion region is formed in an interface between the polysilicon and the high dielectric constant film, and thereby, an equivalent oxide film thickness (EOT) becomes large and a capacitance is reduced.

Here, described is the equivalent oxide film thickness. An electric film thickness of the insulation film acquired by calculating back from a gate capacitance by assuming, independently of the type of the gate insulation film, that the gate insulation film material is the silicon oxide film, is called a silicon equivalent oxide film thickness (EOT: Equivalent Oxide Thickness). That is, when the relative dielectric constant of the insulation film is Eh, the relative dielectric constant of the silicon oxide film is $\in_o$, and the thickness of the insulation film is dh, the silicon equivalent oxide film thickness de is expressed by the following formula 1.

$$de = dh \ast (\in_o / \in_h) \qquad [\text{Formula 1}]$$

The above formula 1 shows that, when as the gate insulating film, a material is used which has large dielectric constant $\in_h$ in comparison with the relative dielectric constant $\in_o$ of the silicon oxide film, the silicon equivalent oxide film thickness becomes equivalent to the film thickness of the silicon oxide film which is thinner than that of this gate insulation film. The relative dielectric constant $\in_o$ of the silicon oxide film is about 3.9. Accordingly, for example, as for a film comprising a high dielectric constant material of $\in_h=39$, even though the physical film thickness is 15 nm, the silicon equivalent oxide film thickness (electrical film thickness) becomes to be 1.5 nm, and while a capacitance value of the gate insulation film is kept equivalent to that of the silicon oxide film having the film thickness of 1.5 nm, a tunnel current can be reduced remarkably.

Currently, as a high dielectric constant film formation technology, commonly are used a MO-CVD method, a method for forming the high dielectric constant film by an ALD method, or a method for forming a metal film on the silicon oxide film by using these methods, and for heat-treating it in an atmospheric pressure atmosphere to form the high dielectric constant film. As a metal electrode formation technology, the MO-CVD method or the ALD method is commonly used.

When a stacked structure of the high dielectric constant film and the metal electrode is formed by using above-mentioned methods, there exists a problem that an interface between the high dielectric constant film and the metal electrode is always exposed to the atmosphere, and impurities adhere to the interface between the high dielectric constant film and the metal electrode, thereby giving adverse effect on the electric characteristics. When the CVD method is used, since carbon is included in the raw material, the electric-characteristic degradation due to this impurity also becomes a problem.

In Patent Document 1, as means to enhance the interfacial property between the high dielectric constant film and the metal electrode, after the high dielectric constant film formation, a method for carrying out the transferring to a metal electrode deposition chamber without breaking a vacuum, and for forming the metal electrode is described. However, in Patent Document 1, since any consideration is not paid for oxygen atmosphere control in the heat-treating step during a high dielectric constant film formation process, there arises a problem that the equivalent oxide film thickness value (EOT) becomes thick. Alternatively, there is a problem that a hysteresis is generated in a C-V curve.

Thus, in the formation of the stucked structure of the high dielectric constant film and the metal electrode, it is a subject to realize, at the same time, the reduction of impurities in these film interfaces, the reduction of impurities in the high dielectric constant film, and the reduction of the equivalent oxide film thickness value.

[Patent document 1] Japanese Patent Laid-Open No. 2006-237371

SUMMARY OF THE INVENTION

A first aspect of the present invention provides a semiconductor manufacturing apparatus including: a load lock chamber; a transfer chamber; and a treatment chamber 1 and a treatment chamber 2 which carry out treatment using plasma, wherein, in the treatment chamber 2, an exhaust means is provided with a control means for making an oxygen partial pressure into $1\ast 10^{-5}$ [Pa] or less.

The semiconductor manufacturing apparatus according to the embodiment of the first aspect of the present invention is characterized in that a treatment chamber 3 where the treatment using the plasma is carried out can be further installed additionally.

The semiconductor manufacturing apparatus according to the embodiment of the first aspect of the present invention further includes an oxygen gas introducing pipe and a substrate-heating system in the treatment chamber 2.

The semiconductor manufacturing apparatus according to the embodiment of the first aspect of the present invention further includes a control means for controlling introduced oxygen gas with an accuracy of ±0.1% relative to a set flow rate thereof in the treatment chamber 2.

The semiconductor manufacturing apparatus according to the embodiment of the first aspect of the present invention further includes a control means for carrying out a sequence of processes among the load lock chamber, the transfer chamber, the treatment chamber 1 and the treatment chamber 2, or among the load lock chamber, the transfer chamber, and the treatment chambers 1, 2 and 3, without exposing those processes to the atmosphere.

The semiconductor manufacturing apparatus according to the embodiment of the first aspect of the present invention is characterized in that an amount of carbon impurities in an interface in a manufactured semiconductor device is made to be $1*10^{20}$ atoms/cm$^3$ or less.

A second aspect of the present invention provides a method for forming a high dielectric constant film and a metal electrode successively, the method including the steps of: (1) depositing a metal film on a silicon oxide film or a silicon oxynitride film in a treatment chamber 1; (2) forming, in a treatment chamber 2, a high dielectric constant film by using the metal film formed in the treatment chamber 1; and (3) depositing, in the treatment chamber 1 or a treatment chamber 3 installed additionally, a metal electrode material on the high dielectric film formed in the treatment chamber 2, wherein the steps are carried out successively without being exposed to the atmosphere.

A deposition method of the metal film in the above step (1) according to the embodiment of the second aspect of the present invention is characterized in that the metal film is formed by a sputtering method in an atmosphere where it is difficult for a metal atom to cause oxidation reaction.

The embodiment of the second aspect of the present invention is characterized in that the deposited metal film contains at least one type of metal element selected from the group consisting of Zr, Hf, Ta, Al, Ti, Nb, Sc, Y, La, Ce, Pr, Nd, Sm, Eu, Gd, Tb, Dy, Ho, Er, Tm, Yb, Si, Fe and Lu.

The embodiment of the second aspect of the present invention is characterized in that a treatment chamber pressure after oxygen introduction in the treatment chamber 2 is $1*10^{-3}$ [Pa] to 10 [Pa] (inclusive) in the execution of step (2).

The embodiment of the second aspect of the present invention is characterized in that above step (2) carries out oxygen introduction and substrate heating at the same time to form the high dielectric constant film.

The embodiment of the second aspect of the present invention is characterized in that the metal electrode film in above step (3) is formed by a reactive sputtering method in a deposition apparatus which can introduce oxygen, nitrogen or nitrous oxide, or oxygen, nitrogen at the same time.

The embodiment of the second aspect of the present invention is characterized in that the metal electrode film in above step (3) can form a metal mixed film of two or more element systems by discharging at least two cathodes at the same time.

The embodiment of the second aspect of the present invention is characterized in that the metal electrode film in above step (3) contains at least one type of metal element selected from the group consisting of Zr, Hf, Ta, Ti, Al, Ru, Si, Ni, Pt, Ir, Er, Yb, La, Dy, Y, Gd, Co, W and C.

According to the present invention, the reduction of impurities in the high dielectric constant film and the reduction of the equivalent oxide film thickness value and the reduction of impurities in the interface between the high dielectric constant film and the metal electrode, which are the current subject can be realized at the same time.

DESCRIPTION OF THE PREFERRED EMBODIMENTS

A summary of an embodiment of a method for forming a high dielectric constant film according to the present invention is shown in the following. First, for example, a silicon oxide film having a thickness from 1 nm to 2 nm or less is formed on a substrate made of single crystal silicon. Then, a metal film having a thickness from 0.1 nm to 0.7 nm or less is formed on the silicon oxide film having a thickness from 1 nm to 2 nm or less by a sputtering method. The formed metal film, without breaking a vacuum, is transferred to a heat treatment chamber having a oxygen partial pressure of $1.0*10^{-8}$ [Pa] or less, and thermal oxidation treatment is carried out under the condition of the substrate temperature being 900° C. or less and of the oxygen partial pressure being $1*10^{-3}$ [Pa] or more and 10 [Pa] or less, to form the high dielectric constant film. After the high dielectric constant film is formed, without breaking the vacuum, the substrate is transferred into a metal film deposition chamber, where a metal electrode film is formed.

Figure 1A:
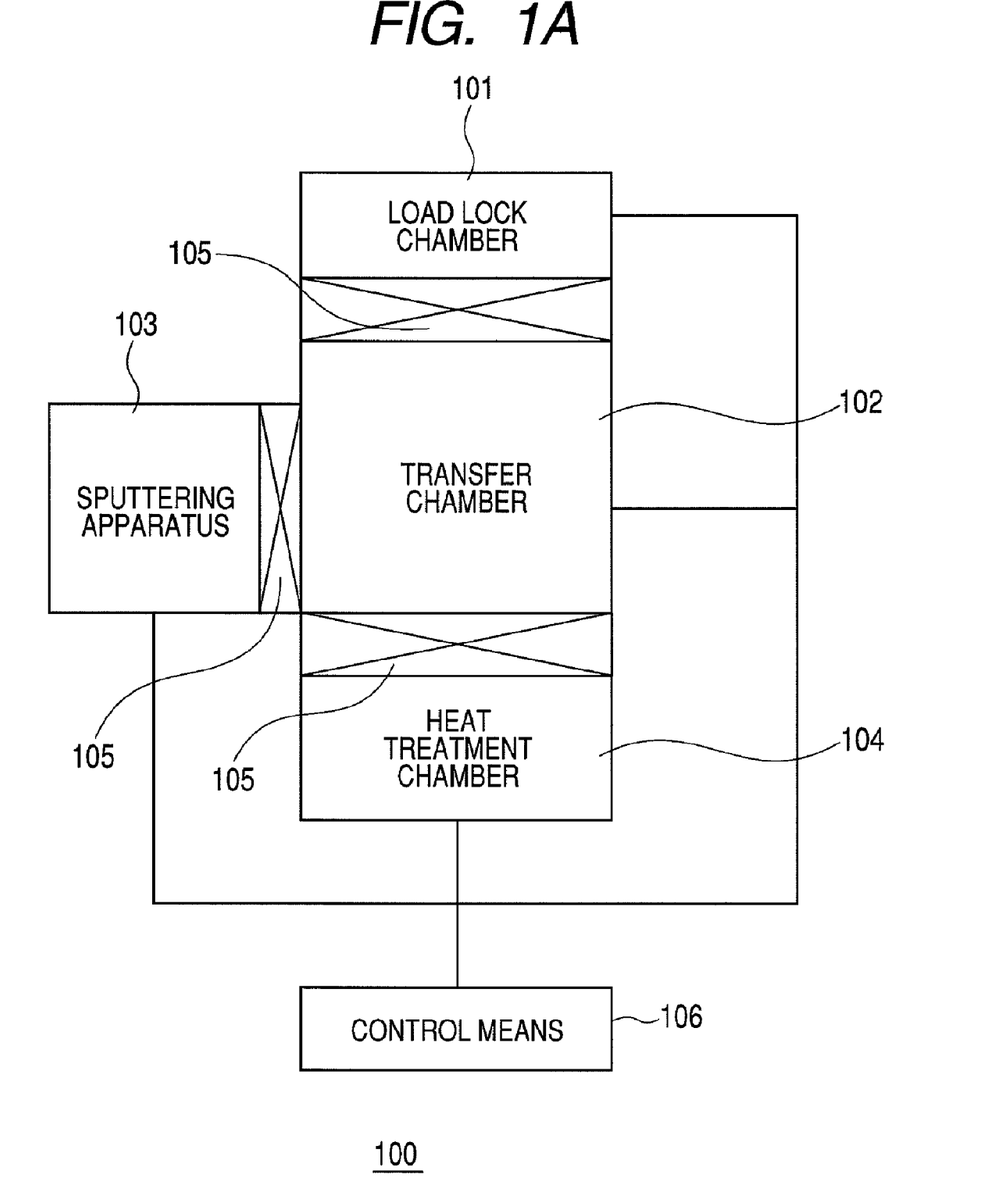
FIG. 1A is a schematic diagram of a semiconductor manufacturing apparatus according to the present invention.
Figure 1B:
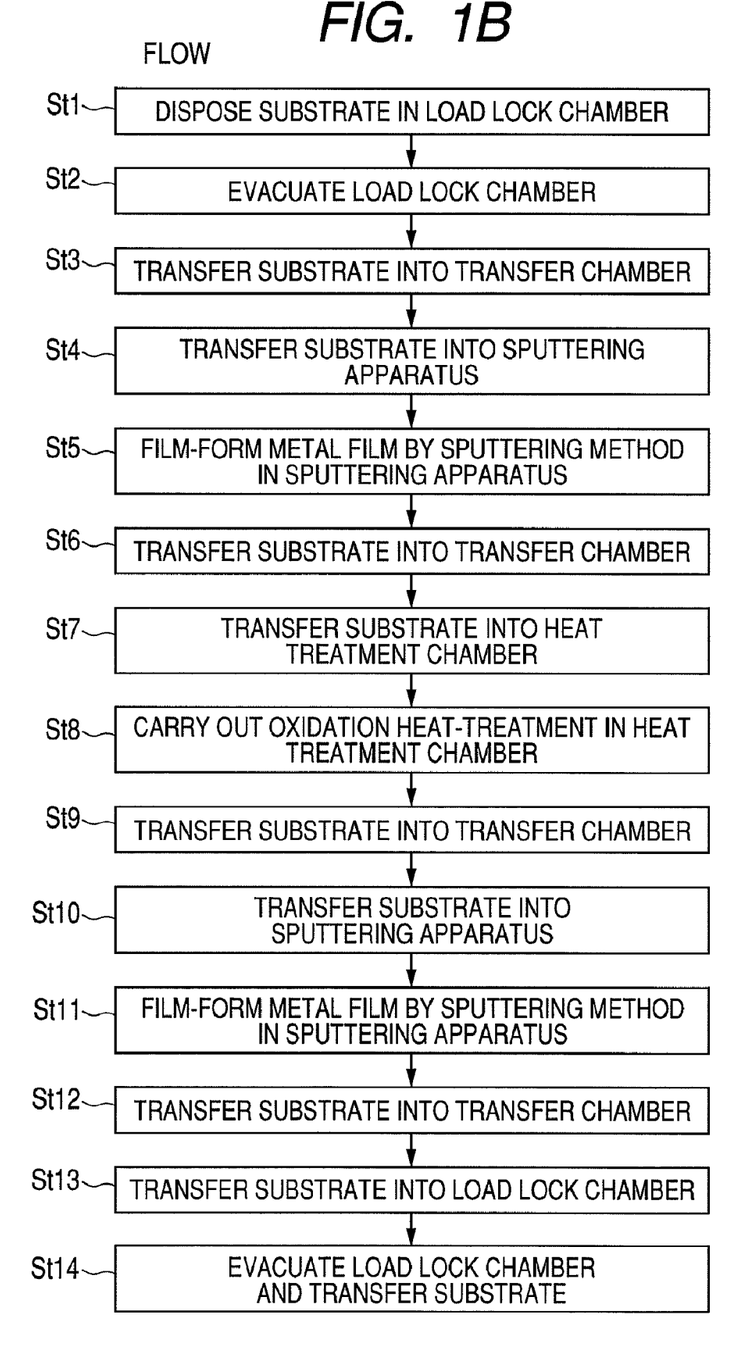
FIG. 1B is a flow chart of an embodiment of the present invention.

A block diagram of a semiconductor manufacturing apparatus for carrying out this treatment is illustrated in FIG. 1A, and a flow chart of this treatment is illustrated in FIG. 1B. As illustrated in FIG. 1A, a semiconductor manufacturing apparatus 100 includes a load lock chamber 101, a transfer chamber 102, a sputtering apparatus 103, a heat treatment chamber 104 and a control means 106. The load lock chamber 101, the sputtering apparatus 103 and the heat treatment chamber 104 are separated from the transfer chamber 102 with a gate valve 105, respectively. The semiconductor manufacturing apparatus 100 is constituted so that the substrate may be taken in and out of the load lock chamber 101, and the substrate disposed in the load lock chamber 101 may be transferred automatically via the transfer chamber 102 to the sputtering apparatus 103 and the heat treatment chamber 104.

Then, FIG. 1B will be described. First, in step 1, the substrate is disposed in the load lock chamber 101. In step 2, the load lock chamber 101 is evacuated. In step 3, the substrate is transferred from the load lock chamber 101 into the transfer chamber 102 via the gate valve 105. In step 4, the substrate is transferred from the transfer chamber 102 into the sputtering apparatus 103 via the gate valve 105. In step 5, on the substrate transferred into the sputtering apparatus 103, the metal film is formed by a well-known sputtering method. The substrate with the metal film formed thereon, in step 6, is transferred from the sputtering apparatus 103 into the transfer chamber 102 via the gate valve 105. In step 7, the substrate transferred into the transfer chamber 102 is transferred into the heat treatment chamber 104 via the gate valve 105. In step 8, the substrate with the metal film formed thereon which has been transferred into the heat treatment chamber 104 is subjected to the thermal oxidation treatment, and the oxide film is formed. In step 9, the substrate with the oxide film formed thereon is transferred from the heat treatment chamber 104 into the transfer chamber 102 via the gate valve 105. The substrate transferred into the transfer chamber 102, in step 10, is transferred into the sputtering apparatus 103 via the gate valve 105. In step 11, on the oxide film of the substrate transferred into the sputtering apparatus 103, the metal film is formed by the well-known sputtering method. The substrate with this metallic film formed thereon, in step 12, is transferred into the transfer chamber 102 via the gate valve 105. In step 13, the substrate transferred into the transfer chamber 102 is transferred into the load lock chamber 101 via the gate valve 105. In step 14, the substrate transferred into the load lock chamber 101 is taken out outside the apparatus, and thereby, a sequence of steps is completed.

Figure 2:
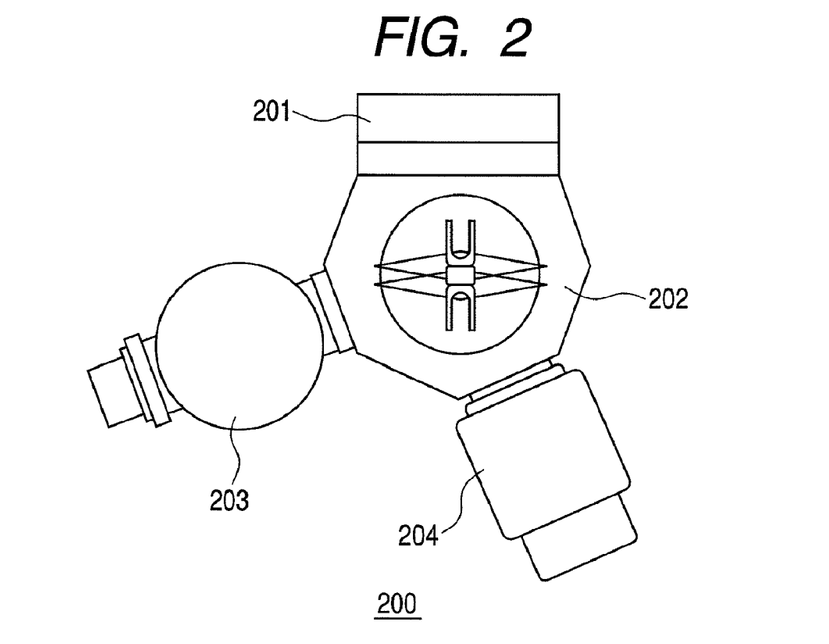
FIG. 2 is a configuration diagram of the semiconductor manufacturing apparatus according to the present invention.

FIG. 2 is a drawing illustrating a more specific structure of a semiconductor manufacturing apparatus 200 carrying out the present invention. A load lock chamber 201 is separated from a transfer chamber 202 by a gate valve which is not illustrated, and thereby, the transfer chamber 202 is isolated from the atmosphere. The load lock chamber 201 is provided with an automatic substrate transfer mechanism, and can carry out taking in and out the substrate before and after treatment while maintaining a vacuum state of the transfer chamber 202. The transfer chamber 202 not only takes in and out the substrate via the load lock chamber 201, but also performs the function to transfer the substrate automatically between a sputtering apparatus 203 and a heat treatment chambers 204 while maintaining a high vacuum state without causing oxidation and impurity contamination of the substrate. The sputtering apparatus 203 is connected with the transfer chamber 202 via the gate valve. The heat treatment chamber 204 is also connected with the transfer chamber 202 via the gate valve similarly.

Figure 3:
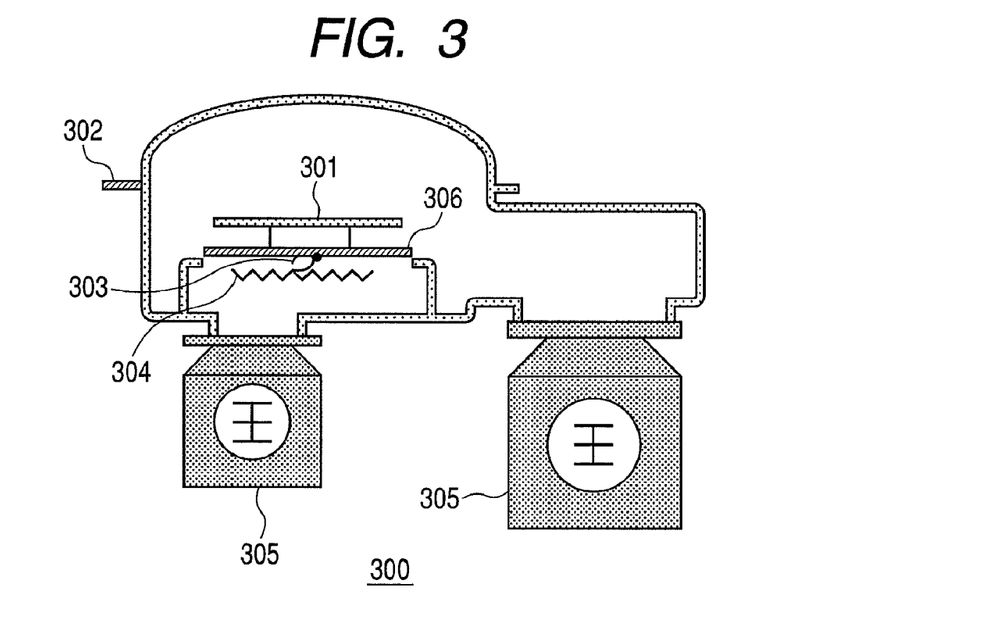
FIG. 3 is a sectional view of a heat treatment chamber according to the present invention.

FIG. 3 is a sectional view of the heat treatment chamber 204 of FIG. 2. A heat treatment chamber 300 includes an oxygen introducing pipe 302, a thermocouple 303, a substrate-heating mechanism 304, a turbo molecular pump 305 and a substrate holder 306, and heat-treats the substrate 301 disposed on this substrate holder 306 while satisfying a predetermined treatment condition.

Figure 4:
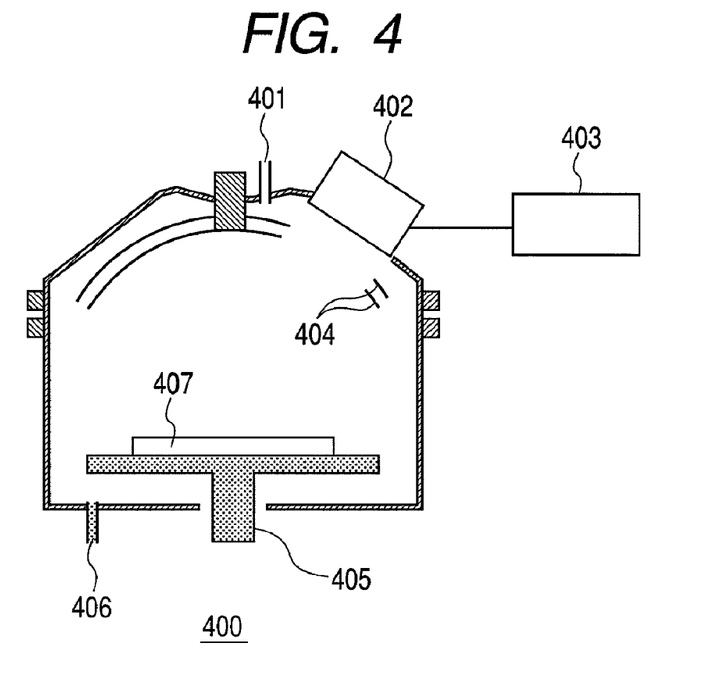
FIG. 4 is a sectional view of a sputtering apparatus according to the present invention.

FIG. 4 is a sectional view of the sputtering apparatus 203 of FIG. 2. A sputtering apparatus 400 includes a sputtering gas introduction part 401, a target (cathode) 402, a DC power supply 403 supplying DC power to the target 402, a shutter 404, a substrate holder 405 and a reactive gas introduction part 406. The substrate 407 is disposed on the substrate holder 405 and treated.

FIG. 5 is a drawing illustrating the stacked structure of the high dielectric constant film and metal electrode film, which are formed according to the principle of the present invention. Reference numeral 501 denotes a silicon substrate; 502, the silicon oxide film; 503, the metal film; 504, a metal silicate film; and 505, the metal electrode film.

Figure 5A:
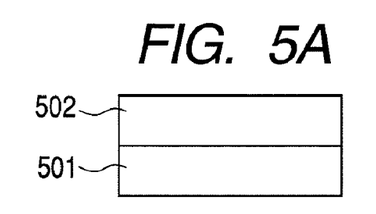
FIG. 5A is a schematic diagram of a stacked structure of a high dielectric constant film and a metal electrode film, which is formed according to the principle of the present invention.

FIG. 5A illustrates a state where the silicon oxide film 502 is formed on the substrate 501. The substrate 501 is made of the single crystal silicon etc. having, for example, a (100) plane orientation, and furthermore, is doped with phosphorus where the resistance is controlled in the range of 2 to 10 ohm*cm. In the present embodiment, as for the substrate 501, a P-type single crystal silicon substrate having diameter of 200 mm was used.

The surface of this substrate 501 is cleaned by a RCA cleaning, and a metal, an organic matter, a particle, and a natural oxide film, etc. on the surface of the substrate were removed. Then, the substrate 501 with a clean silicon atom exposed at the surface thereof by the cleaning was transferred into a rapid thermal oxidation treatment apparatus which was not illustrated. Then, the thermal oxidation at 1000° C. was carried out in the oxygen atmosphere, and the silicon oxide film was formed. Since too much thickness of the silicon oxide film makes it difficult to suppress an equivalent oxide film thickness value low, it is desirable that the film thickness value is from 1 nm to 2 nm or less. In the present embodiment, a thermal oxidation method was used in the silicon oxide film formation. However, it is possible to use other suitable means, such as a radical oxidation method, by which a good silicon interface is acquired. Thereby, as illustrated in FIG. 5A, the silicon oxide film 502 of 1.8 nm in thickness was formed on the surface of the substrate 501.

After the silicon oxide film 502 was formed, the substrate 501 was placed in the load lock chamber 201 of the semiconductor manufacturing apparatus 200 illustrated in FIG. 2. After decompressing to $3.0*10^{-5}$ [Pa] was carried out, the substrate 501 was transferred to a DC magnetron sputtering apparatus 203 via the transfer chamber 202 maintaining the ultra-high vacuum state.

In the present embodiment, as a target in the sputtering apparatus 203, Hf is used. On the transferred silicon oxide film 502, an Hf film 503 is formed by the sputtering method. It is desirable that the sputtering apparatus 203 has an atmosphere where it is difficult for the metal film such as the Hf film 503 formed by the spattering to cause oxidation reaction. Before the substrate 501 is transferred into the sputtering apparatus 203, it is desirable that the inside of the sputtering apparatus 203 is evacuated to the ultra-high vacuum state, and specifically, is decompressed to $1.0*10^{-6}$ [Pa] or less. A method of the apparatus carrying out the spattering may be any treatment method such as the DC magnetron sputtering method or a RF magnetron sputtering method, besides an ECR sputtering method.

In the sputtering apparatus 203, as illustrated in FIG. 4, the target 402 is installed in a diagonal direction relative to the substrate 407, and it is possible to mount a plurality of targets at the same time. Furthermore, the substrate holder 405 where the substrate 407 is placed, has a mechanism to rotate at an arbitrary number of revolution.

Figure 5B:
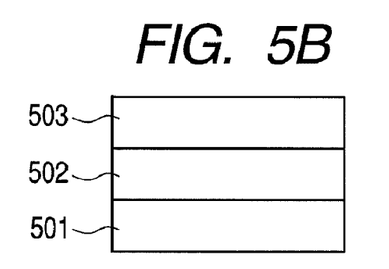
FIG. 5B is a schematic diagram of the stacked structure of the high dielectric constant film and the metal electrode film, which is formed according to the principle of the present invention.

Subsequently, argon gas with a flow rate of 20 sccm was introduced into the sputtering apparatus 203 decompressed to $1.0*10^{-6}$ [Pa] or less by the reactive gas introduction part 406, and the chamber pressure in the sputtering apparatus 203 was maintained at 0.02 Pa. Subsequently, to the target 402, a DC power of 100 W was applied from the DC power supply 403 to generate plasma, and in the atmosphere of the gas supplied from the sputtering gas introduction part 401, the sputtering of the Hf atom was carried out. The sputtered Hf atoms come flying in the direction of the substrate 407 (501) held at the position opposing the target, and are deposited on the silicon oxide film 502, thereby forming the Hf film 503. By this treatment, as illustrated in FIG. 5B, the Hf film 503 of 0.5 nm thickness was formed on the silicon oxide film 502.

Then, the substrate 501 with the Hf film 503 formed thereon was transferred into the heat treatment chamber 204 via the transfer chamber 202. At this time, the transfer chamber 202 is maintained in the ultra-high vacuum state so that the Hf film 503 deposited on the substrate 501 may not be oxidized. Before the substrate 501 is transferred into the heat treatment chamber 204, the oxygen partial pressure in the heat treatment chamber 204 is $1.0*10^{-8}$ Pa or less and even if the Hf film 503 having strong adsorptive property of the oxygen is transferred, it is not oxidized.

Figure 5C:
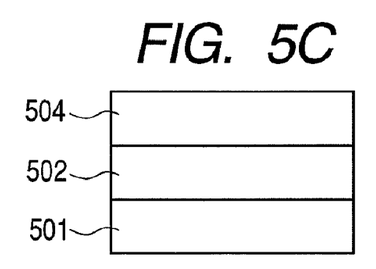
FIG. 5C is a schematic diagram of the stacked structure of the high dielectric constant film and the metal electrode film, which is formed according to the principle of the present invention.

The substrate-heating mechanism 304 in the heat treatment chamber 204, which is illustrated in FIG. 3, needs to be set at a desired setting temperature. In the present embodiment, in the state set at 850° C., the substrate 301 (501) was transferred. After the transferred substrate 301 (501) was placed at the substrate holder 306, immediately the oxygen was introduced by the oxygen introducing pipe 302 so that the pressure thereof may reach a desired pressure value. In the present embodiment, the oxygen gas of 10 sccm was introduced into the heat treatment chamber 204, and the chamber pressure of the heat treatment chamber 204 was maintained at 0.1 Pa, and a heating oxidation treatment was carried out and as illustrated in FIG. 5C, an Hf silicate film was formed as a metal silicate film 504.

Then, the substrate 501, again, was transferred into the DC magnetron sputtering apparatus 203 via the transfer chamber 202. The transfer chamber 202 is maintained in the state of the ultra-high vacuum state with extremely little residue oxygen so that the surface of the formed Hf silicate film 504 may not be oxidized, or may not be contaminated with impurities due to carbon.

Figure 5D:
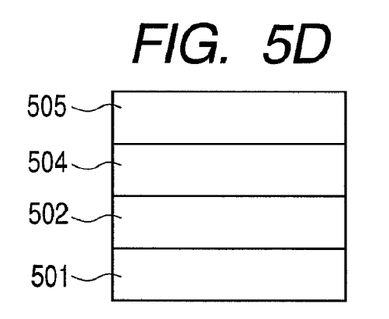
FIG. 5D is a schematic diagram of the stacked structure of the high dielectric constant film and the metal electrode film, which is formed according to the principle of the present invention.

After the substrate 501 was transferred into the sputtering apparatus 203, the argon gas of the flow rate of 20 sccm and nitrogen gas of 15 sccm were introduced by reactive gas introduction part 406 into the sputtering apparatus 203 at the same time as nitriding sources, and the pressure in the sputtering apparatus 203 was maintained at 0.03 Pa. Subsequently, from the DC power supply 403 to the target 402, the DC power of 1000 W was applied to generate the plasma, and the sputtering of a Ti atom constituting the target was carried out. Since the reactive gas is used, as illustrated in FIG. 5D, a TiN film is formed on the metal silicate film 504 as a metal electrode film 505. In order to form a TiON/TiN stacked film or a TiN/TiON stacked film, it is also possible to introduce the oxygen and the nitrogen gas or nitrous oxide gas.

Figure 6A:
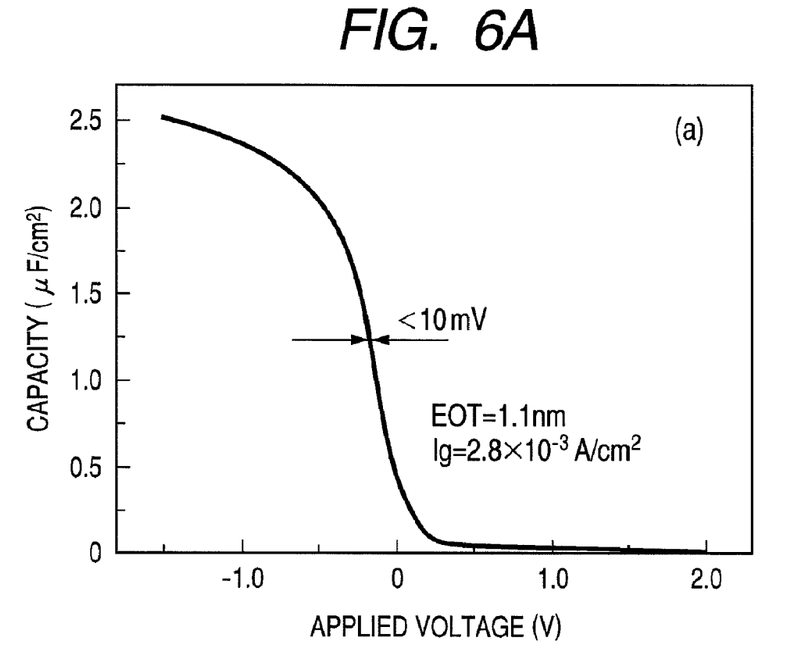
FIG. 6A is a graph illustrating CV characteristics of the stacked structure acquired by a method according to the present invention.

FIG. 6A is a graph illustrating a C-V characteristic which is a changing characteristic of the electrostatic capacity ($\mu F/cm^2$) relative to an applied voltage (V) in the stacked structure, formed using the method according to the present invention, of the high dielectric constant film and the metal electrode material. According to this graph, it turns out that an excellent electric characteristic such that the equivalent oxide film thickness value is 1.1 nm, and a value of the hysteresis thereof is 10 mV or less has been acquired.

Figure 6B:
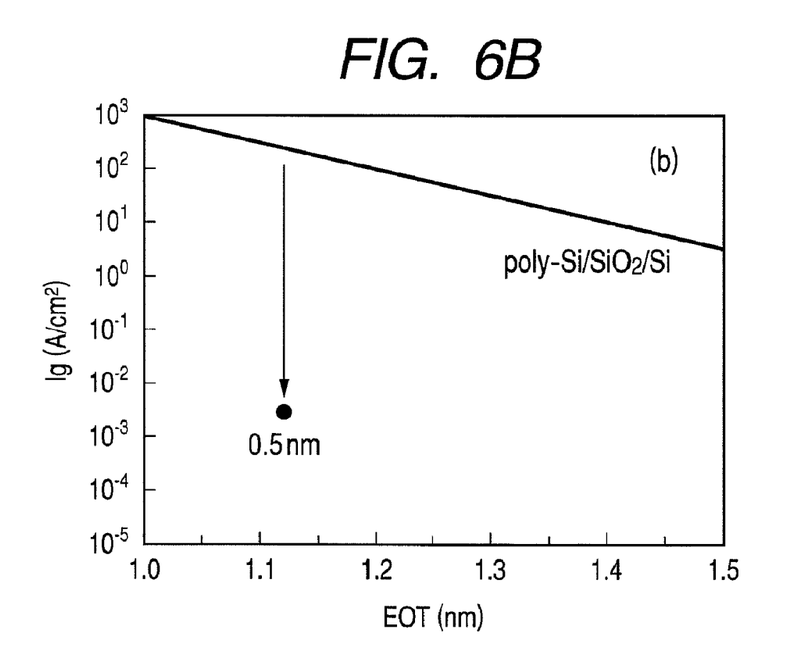
FIG. 6B is a graph illustrating a changing characteristic of a leakage current value relative to an equivalent oxide film thickness (EOT) of the stacked structure acquired by a method according to the present invention.

FIG. 6B is a graph illustrating a changing characteristic of a leakage current value Ig ($A/cm^2$) relative to the equivalent oxide film thickness (EOT) (nm). According to the present invention, it turns out that the leakage current value can be reduced to $1/10^5$ as compared with the silicon oxide film and polysilicon electrode of the conventional structure.

Figure 7A:
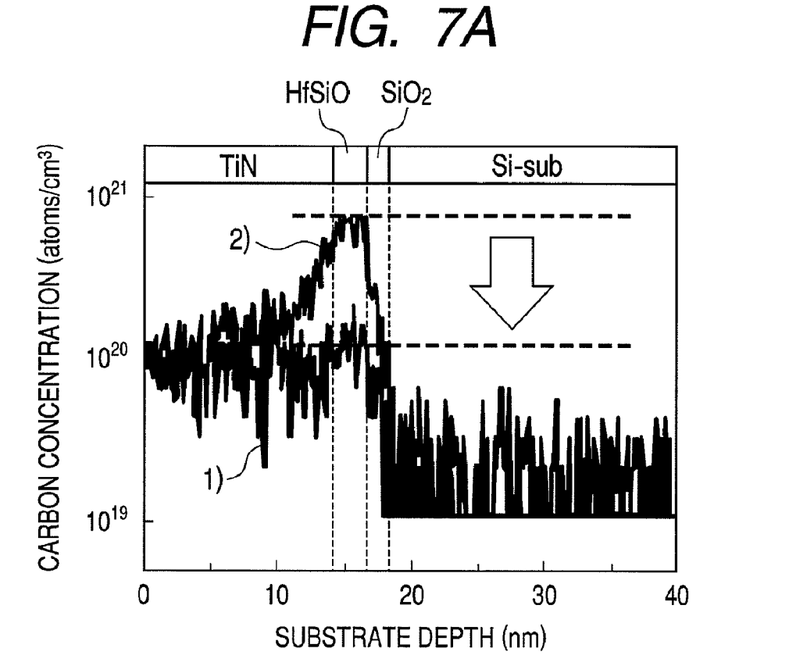
FIG. 7A is a graph illustrating an analysis result by comparing a method according to the present invention with a method of an atmospheric exposure.

FIG. 7A shows an SIMS analysis result when comparing the stacked structure formed according to the present invention with the stacked structure in which the TiN film is formed after the Hf silicate film is formed and the atmospheric exposure is carried out once. Then, FIG. 7A illustrates the variation of the carbon concentration ($atoms/cm^3$) relative to a substrate depth (nm). Reference numeral 1) denotes an analysis result of the stacked structure formed according to the present invention, and reference numeral 2) denotes an analysis result of the stacked structure in which the TiN film is formed after the Hf silicate film is formed and the atmospheric exposure is carried out once. As compared with the stacked structure when carrying out atmospheric exposure once after the Hf silicate film formation, the stacked structure formed according to the present invention shows that the peak of the carbon in the interface between the Hf silicate film and the TiN film has been restrained to be $1/10$.

Figure 7B:
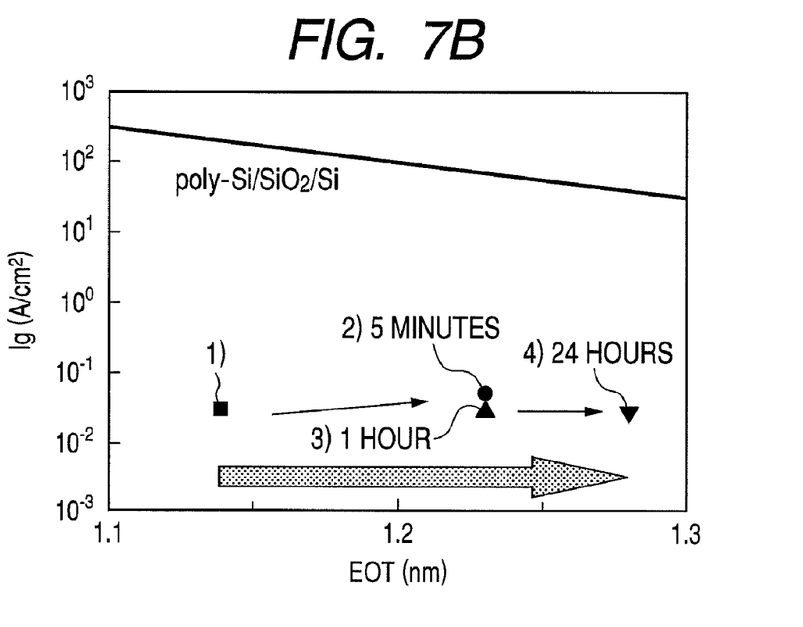
FIG. 7B is a graph illustrating an analysis result by comparing a method according to the present invention with a method of an atmospheric exposure.

FIG. 7B is a graph illustrating the variation of the leakage current value ($A/cm^2$) relative to the equivalent oxide film thickness (EOT) (nm). Reference numeral 1) denotes an analysis result of the stacked structure formed according to the present invention; 2), an analysis result when the atmospheric exposure time is 5 minutes; 3), an analysis result when the atmospheric exposure time is 1 hour; and 4), an analysis result when the atmospheric exposure time is 24 hours. From FIG. 7B, it turns out that the leakage current value does not change much, but the equivalent oxide film thickness value increases as the atmospheric exposure time increases.

Figure 7C:
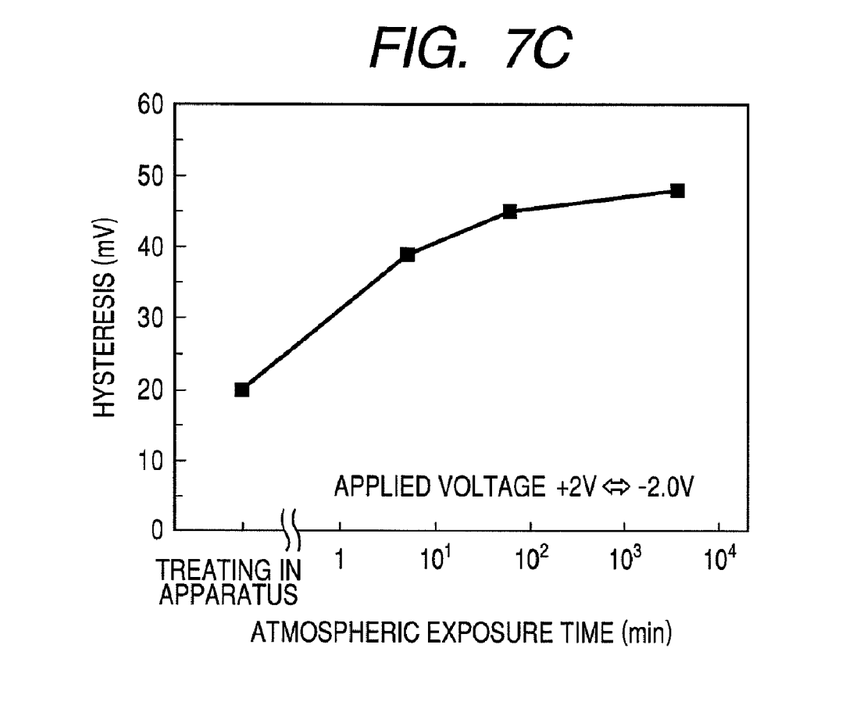
FIG. 7C is a graph illustrating an analysis result by comparing a method according to the present invention with a method of an atmospheric exposure.

FIG. 7C is a graph illustrating the changing characteristic of the hysteresis (mV) relative to the atmospheric exposure time (min). From FIG. 7C, it turns out that the value of the hysteresis increases as the atmospheric exposure time increases. That is, electric characteristics can be enhanced by restraining the carbon concentration to around $1*10^{20}$ atoms/$cm^3$ or less.

In the above-mentioned description, although the TiN/Hf-SiO/SiO2/Si structure is described, it does not intend to limit a type of the metal electrode film to be formed or the metal silicate film to be formed.

The original substrate 501 preferably has a thin SiO2 or SiON layer evaporated in advance. A material to be evaporated on this film by using an oblique-angle PVD module is, preferably, a heat-resistant metal such as Hf, Ta and Zr, a metal nitride such as HfN, TaN and TiN, a metal alloy such as HfTa and HfTi, a metal-semiconductor alloy such as HfSi, and a metal alloy nitride such as TaSiN. It is also possible to form these two or more films by evaporation as the stacked structure. For example, they are Hf/SiN/Hf, HfN/AlN/, Hf, etc. Usually, Hf, Zr, Ti or Ta is used as the metal target 402. However, also the other metal target 402 can be used. When the metal-semiconductor alloy is evaporated, it is preferred that the semiconductor material is Si.

A gate material may be the metal such as Ta, Ru and Hf, the metal nitride such as TiN, HfN and TaN, the metal alloy such as RuTa and HfTa, the metal-semiconductor alloy such as HfSi and TaSi, a metal-semiconductor alloy nitride such as TaSiN, or an stacked body comprising these films such as Hf/TaN/TiN and Ru/Ta/TaN, for example.

With respect to the contents of the present invention, a specific achievement will be described in the following in comparison with a conventional technology. For the metal-oxide-semiconductor field-effect transistor (MOSFETs) further advanced from the 45 nm technology node, a metal/High-K gate stacked structure is indispensable. A metal gate and a high dielectric constant thin film which are formed by a chemical vapor deposition (CVD) method have been investigated by many groups. However, it has been reported that it has become a serious problem that a device performance deteriorates due to residual impurities in a high-K thin film and a metal/High-K dielectric interface. Refer to, for example, T. Kawahara, K. Torii, R. Mitsuhashi, A. Muto, A. Horiuchi, H. Ito, and H. Kitajima: Japanese Journal of Applied Physics 43 (2004) 4129, etc.

Conventionally, by using a solid phase interface reaction (SPIR) between an ultrathin physical vapor deposition (PVD) metal layer and a SiO2 lower layer, a method of manufacturing a high quality silicate gate dielectric has been demonstrated. In that case, by using a PVD growth metal layer, carbon impurities in the thin film were able to be reduced in comparison with the CVD method. Since a SPIR process in conventional investigations was carried out outside the proper position (ex-situ), the interface was not able to be exactly controlled, and impurities due to the atmospheric exposure were not able to be exactly controlled.

In order to clarify an effect of the interface and impurities, the PVD method in the proper position (in-situ) has been proposed by the present invention. The in-situ PVD method is the one for forming a High-K gate dielectric by the SPIR and forming the metal electrode successively by the low damage sputtering system using a cluster tool. According to the present invention, improved is the device performance of the P-type metal/insulator/semiconductor field-effect transistor (MISFETs) forming the gate stacked structure at the beginning, which uses the TiN/Hf silicate stacked structure manufactured by the in-situ PVD method.

Figure 8A:
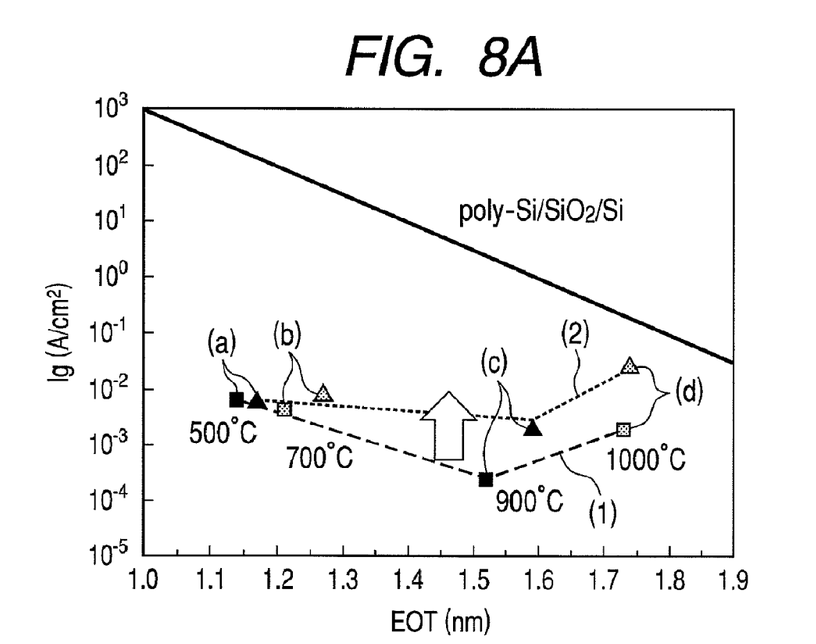
FIG. 8A is a graph illustrating an analysis result by comparing a method according to the present invention with a method of an atmospheric exposure.

FIG. 8A is a curve, after annealing treatment, of a gate leakage current (A/$cm^2$) relative to the equivalent oxide film thickness value (EOT) (nm) with respect to the TiN/Hf silicate stacked structure manufactured by the in-situ PVD method (vacuum-consistent) and the atmospheric exposure PVD method (atmospheric exposure time: 24 hours). FIG. 8A shows a result acquired under the condition of a treating time of 30 seconds in a nitrogen gas atmosphere. Reference numeral 1) denotes a curve, after annealing treatment, of the gate leakage current (A/$cm^2$) relative to the equivalent oxide film thickness value (EOT) (nm) with respect to the TiN/Hf silicate stacked structure manufactured by the vacuum-consistent PVD method, and reference numeral 2) denotes a curve, after annealing treatment, of the gate leakage current (A/$cm^2$) relative to the equivalent oxide film thickness value (EOT) (nm) with respect to the TiN/Hf silicate stacked structure manufactured by the atmospheric exposure PVD method. Reference symbol (a) denotes measurement results of the equivalent oxide film thickness value (EOT) and the gate leakage current when annealing at annealing temperatures of 500 degrees. Reference symbols (b), (c) and (d) denote measurement results when annealing at the annealing temperatures of 700 degrees, 900 degrees and 1000 degrees, respectively. As for the gate leakage current after a high temperature annealing treatment, acquired was a result that the current of the stacked structure manufactured by the vacuum-consistent PVD method is reduced to $\frac{1}{10}$ in comparison with that of the atmospheric exposure PVD method. The heat resistance of the TiN/Hf silicate stacked structure manufactured by the vacuum-consistent PVD method was maintained satisfactorily.

Figure 8B:
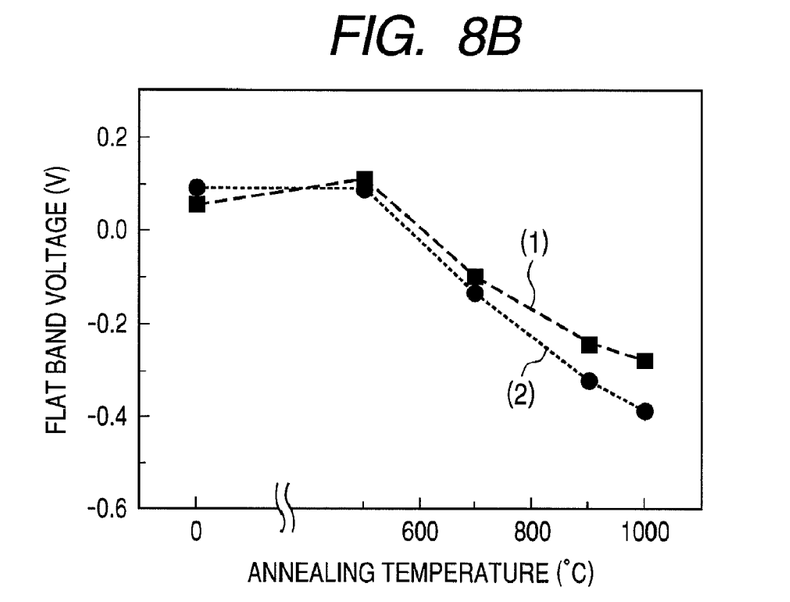
FIG. 8B is a graph illustrating an analysis result by comparing a method according to the present invention with a method of an atmospheric exposure.

Then, with respect to the TiN/Hf silicate stacked structure manufactured by the in-situ method (vacuum-consistent) and the atmospheric exposure PVD method (atmospheric exposure time: 24 hours), a relation between the annealing temperature (° C.) and a flat band voltage (V) after annealing treatment is shown in FIG. 8B. FIG. 8B shows a result acquired under the condition of the treating time of 30 seconds in the nitrogen gas atmosphere. Reference numeral (1) denotes, with respect to the TiN/Hf silicate stacked structure manufactured by the vacuum-consistent PVD method, a variation of the flat band voltage relative to the annealing temperature after annealing treatment, and reference numeral (2) denotes, with respect to the TiN/Hf silicate stacked structure manufactured by the atmospheric exposure PVD method, a variation of the flat band voltage relative to the annealing temperature after annealing treatment. As a result, the vacuum-consistent process gives a smaller shift amount of the flat band voltage than the process of the atmospheric exposure time: 24 hours. Furthermore, the heat resistance of the TiN/Hf silicate stacked structure manufactured by the vacuum-consistent PVD method was maintained satisfactorily.

Figure 9:
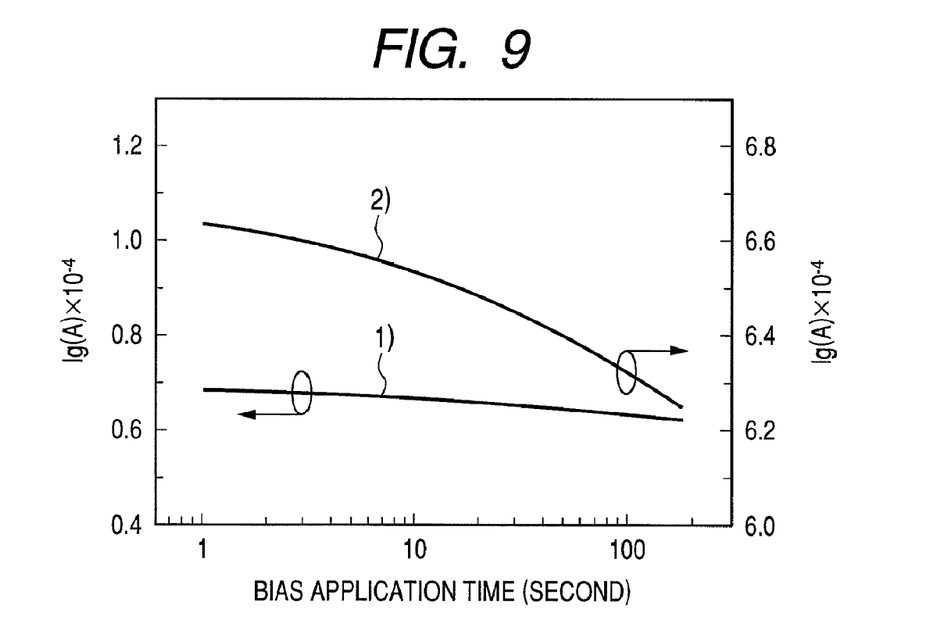
FIG. 9 is a graph illustrating an analysis result by comparing a method according to the present invention with a method of an atmospheric exposure.

FIG. 9 shows a result of a long-term reliability test with respect to the TiN/Hf silicate stacked structure manufactured by the In-situ method (vacuum-consistent) and the atmospheric exposure PVD method (atmospheric exposure time: 24-hours). Reference numeral (1) denotes, with respect to the TiN/Hf silicate stacked structure manufactured by the vacuum-consistent PVD method, a variation of the leakage current value ($1*10^{-4}$ A) (left vertical axis) relative to an applied voltage time (second). Reference numeral (2) denotes, with respect to the TiN/Hf silicate stacked structure manufactured by the atmospheric exposure PVD method, a variation of the leakage current value ($1*10^{-1}$ A) (right vertical axis) relative to an applied voltage time (second). It turned out that the TiN/Hf silicate stacked structure manufactured by the In-Situ method gives a smaller variation of the gate leakage current than the TiN/Hf silicate stacked structure manufactured by the atmospheric exposure PVD method.

As a conclusion, it has been demonstrated that, by using the in-situ PVD method in order to manufacture the TiN/Hf silicate gate stacked structure, the electric characteristics of the stacked structure can be improved in comparison with the stacked structure manufactured by the ex-situ PVD method and the conventional CVD method. Furthermore, the in-situ PVD method can reduce the carbon impurities in the stacked structure. After the annealing treatment at 1000 degrees, although the EOT value rises clearly, the shift amount of the flat band voltage Vfb can be improved.

The above-mentioned embodiments are not intended to limit the scope of the present invention, and based on an enlightening and/or an implication of the present embodiment, the above-mentioned various embodiments can be altered arbitrarily for realizing the subject matter of the claims of the present invention.

What is claimed is:

1. A semiconductor device manufacturing apparatus, comprising:
    a load lock chamber;
    a first treatment chamber and a second treatment chamber which carry out plasma treatment;
    a transfer chamber connected with the load lock chamber and the first and the second treatment chambers via gate valves;
    means for transferring a treated material; and
    a control means for controlling the transferring means so that the treated material is transferred within vacuum environment via the transfer chamber by opening and closing the gate valve among the load lock chamber, the first and the second treatment chambers, and for controlling gas pressure in the first and the second treatment chambers,
    wherein the apparatus performs an in-situ PVD method which forms a high dielectric film on a treated material by reacting a metal film and a silicon-containing film, and forms a metal electrode film on the high dielectric film without exposing the treated material to the atmosphere, and
    wherein:
    the first treatment chamber includes means for depositing the metal film on a silicon oxide film or a silicon oxynitride film having a thickness from 1 nm to 2 nm or less to form the treated material by a sputtering method;
    the second treatment chamber includes means for heat-treating the metal film of the treated material to form the high dielectric film;
    the control means transfers, within vacuum environment, the treated material with the metal film deposited thereon in the first treatment chamber to the second treatment chamber by the transferring means via the transfer chamber;
    the control means controls oxygen partial pressure in the second treatment chamber into $1\times10^{-8}$ [Pa] or less when transferring the treated material to the second treatment chamber, and then, controls the oxygen partial pressure into $1\times10^{-3}$ [Pa] or more and 10 [Pa] or less when heat-treating the metal film on the treated material to form the high dielectric film, thereby forming the high dielectric film in the second treatment chamber;
    the control means introduces oxygen to the second treatment chamber after the treated material is transferred to the second treatment chamber during heat-treating the metal film on the treated material; and
    the control means controls annealing treatment after depositing a metal electrode material on the high dielectric film so as to be carried out at the temperature of 700° C. or more.

2. A semiconductor device manufacturing apparatus according to claim 1, wherein, furthermore, a third treatment chamber carrying out the plasma treatment on the treated material is connected with the transfer chamber via the gate valve.

3. A semiconductor device manufacturing apparatus according to claim 1, wherein the control means controls a flow rate of the oxygen gas introduced into the second treatment chamber with an accuracy of ±0.1% relative to a set flow rate thereof.

4. A semiconductor device manufacturing apparatus according to claim 1, wherein an amount of carbon impurities in an interface between a high dielectric constant film and the metal electrode of the semiconductor device manufactured from the treated material is made to be $1\times10^{20}$ atoms/cm$^3$ or less.

5. A semiconductor device manufacturing apparatus according to claim 1, wherein the metal film deposited in the first treatment chamber by the sputtering method has a thickness from 0.1 nm to 0.7 nm or less.

6. A method for manufacturing a semiconductor device by using a semiconductor apparatus including a load lock chamber, a first treatment chamber and a second treatment chamber which carry out plasma treatment, and a transfer chamber connected with the load lock chamber and the first and the second treatment chambers via gate valves, performing an in-situ PVD which forms a high dielectric film on a treated material by reacting a metal film and a silicon-containing film, and forms a metal electrode film on the high dielectric film without exposing the treated material to the atmosphere; and
    the method comprising the steps of:
    depositing the metal film on a silicon oxide film or a silicon oxynitride film having a thickness from 1 nm to 2 nm or less to form a treated material in the first treatment chamber by a sputtering method;
    heat-treating the metal film of the treated material to form the high dielectric film in the second treatment chamber;
    depositing a metal electrode material on the formed high dielectric film, and then carrying out annealing treatment at temperature of 700° C. or more;
    transferring, within vacuum environment, the treated material with the metal film deposited thereon in the first treatment chamber to the second treatment chamber via the transfer chamber;
    making oxygen partial pressure in the second treatment chamber into $1\times10^{-8}$ [Pa] or less when transferring the treated material to the second treatment chamber, and then making the oxygen partial pressure into $1\times10^{-3}$ [Pa] or more and 10 [Pa] or less when heat-treating the metal film of the treated material to form the high dielectric film; and
    introducing oxygen to the second treatment chamber after the treated material is transferred to the second treatment chamber during heat-treating the metal film on the treated material to form the high dielectric film.

7. A method according to claim 6, wherein, the deposition of the metal film forms the metal film by a sputtering method in an atmosphere where it is difficult for a metal atom to cause oxidation reaction.

8. A method for manufacturing a semiconductor device according to claim 6, wherein the metal film contains at least one type of metal element selected from the group consisting of Zr, Hf, Ta, Al, Ti, Nb, Sc, Y, La, Ce, Pr, Nd, Sm, Eu, Gd, Tb, Dy, Ho, Er, Tm, Yb, Si, Fe, and Lu.

9. A method for manufacturing a semiconductor device according to claim 6, wherein the oxygen introduction and the heat-treating of the metal film are carried out at the same time to form a high dielectric constant film.

10. A method for manufacturing a semiconductor device according to claim 6, wherein the metal electrode film is formed by a reactive sputtering method by introducing gas containing nitrogen.

11. A method for manufacturing a semiconductor device according to claim 6, wherein the metal electrode film is formed as a metal mixed film of two or more element systems by discharging at least two cathodes at the same time.

12. A method for manufacturing a semiconductor device according to claim 6, wherein the metal electrode material contains at least one type of metal element selected from the group consisting of Zr, Hf, Ta, Ti, Al, Ru, Si, Ni, Pt, Ir, Er, Yb, La, Dy, Y, Gd, Co, W and C.

13. A method for manufacturing a semiconductor device according to claim 6, wherein the metal film deposited in the first treatment chamber by the sputtering method has a thickness from 0.1 nm to 0.7 nm or less.

* * * * *